(12) United States Patent
Wang et al.

(10) Patent No.: US 7,893,493 B2
(45) Date of Patent: Feb. 22, 2011

(54) STACKING FAULT REDUCTION IN EPITAXIALLY GROWN SILICON

(75) Inventors: Yun-Yu Wang, Poughquag, NY (US); Linda Black, Wappingers Falls, NY (US); Judson R. Holt, Wappingers Falls, NY (US); Woo-Hyeong Lee, Poughquag, NY (US); Scott Luning, Poughkeepsie, NY (US); Christopher D. Sheraw, Poughkeepsie, NY (US)

(73) Assignees: International Business Machines Corproation, Armonk, NY (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/456,326

(22) Filed: Jul. 10, 2006

(65) Prior Publication Data

US 2008/0006876 A1 Jan. 10, 2008

(51) Int. Cl.
*H01L 27/12* (2006.01)
*H01L 21/302* (2006.01)
*H01L 21/461* (2006.01)

(52) U.S. Cl. .............................. 257/347; 257/E21.131; 438/739

(58) Field of Classification Search ................. 257/347, 257/E21.651, E21.131, E21.567; 438/241, 438/244, 245, 387, 388, 739, 982
See application file for complete search history.

(56) References Cited

U.S. PATENT DOCUMENTS 4,820,654 A  4/1989  Lee
6,534,351 B2  3/2003  Muller et al.
6,555,891 B1 *  4/2003  Furukawa et al. ........... 257/505
6,680,522 B1  1/2004  Sato
7,348,633 B2 *  3/2008  Lee et al. ..................... 257/347
2002/0093053 A1 *  7/2002  Chan et al. .................. 257/347
2002/0102852 A1  8/2002  Verhavebeke et al.
2004/0256700 A1  12/2004  Doris et al.
2005/0280121 A1 *  12/2005  Doris et al. .................. 257/629
2006/0105536 A1 *  5/2006  Cheng et al. ................. 438/386

OTHER PUBLICATIONS

U.S. Appl. No. 12/131,214, Office Action dated Apr. 16, 2009.
U.S. Appl. No. 12/131,214, filed Jun. 2, 2008, Notice of Allowance dated Oct. 23, 2009.

* cited by examiner

*Primary Examiner*—Anh Phung
*Assistant Examiner*—Allison P Bernstein
(74) *Attorney, Agent, or Firm*—Ian D. MacKinnon; Hoffman Warnick LLC

(57) ABSTRACT

An intermediate hybrid surface orientation structure may include a silicon-on-insulator (SOI) substrate adhered to a bulk silicon substrate, the silicon of the SOI substrate having a different surface orientation than that of the bulk silicon substrate, and a reachthrough region extending through the SOI substrate to the bulk silicon substrate, the reachthrough region including a silicon nitride liner over a silicon oxide liner and a silicon epitaxially grown from the bulk silicon substrate, the epitaxially grown silicon extending into an undercut into the silicon oxide liner under the silicon nitride liner, wherein the epitaxially grown silicon is substantially stacking fault free.

7 Claims, 7 Drawing Sheets

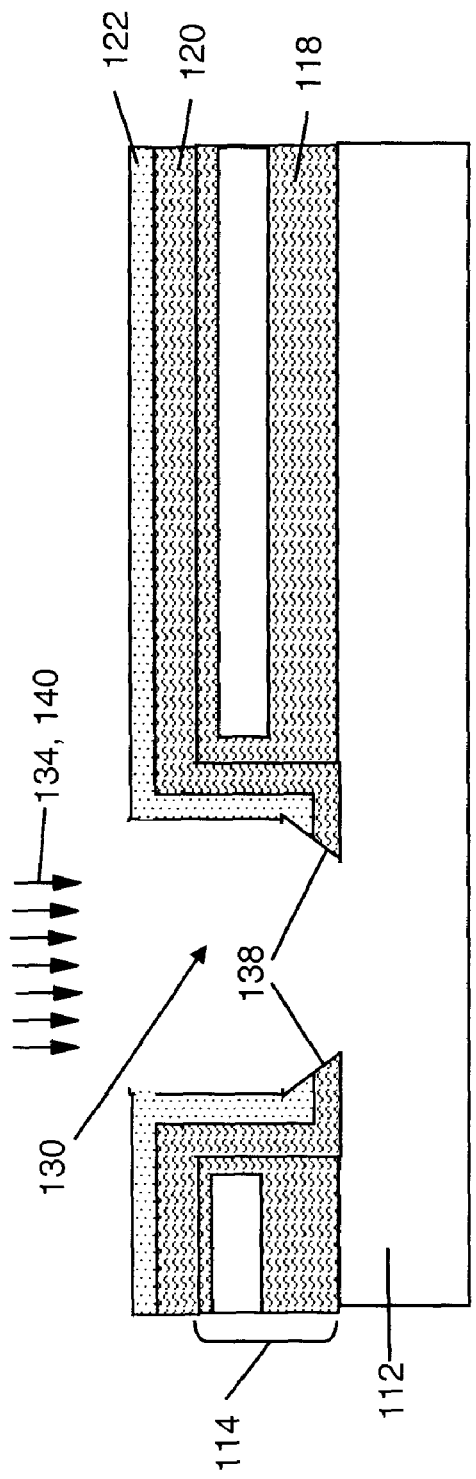
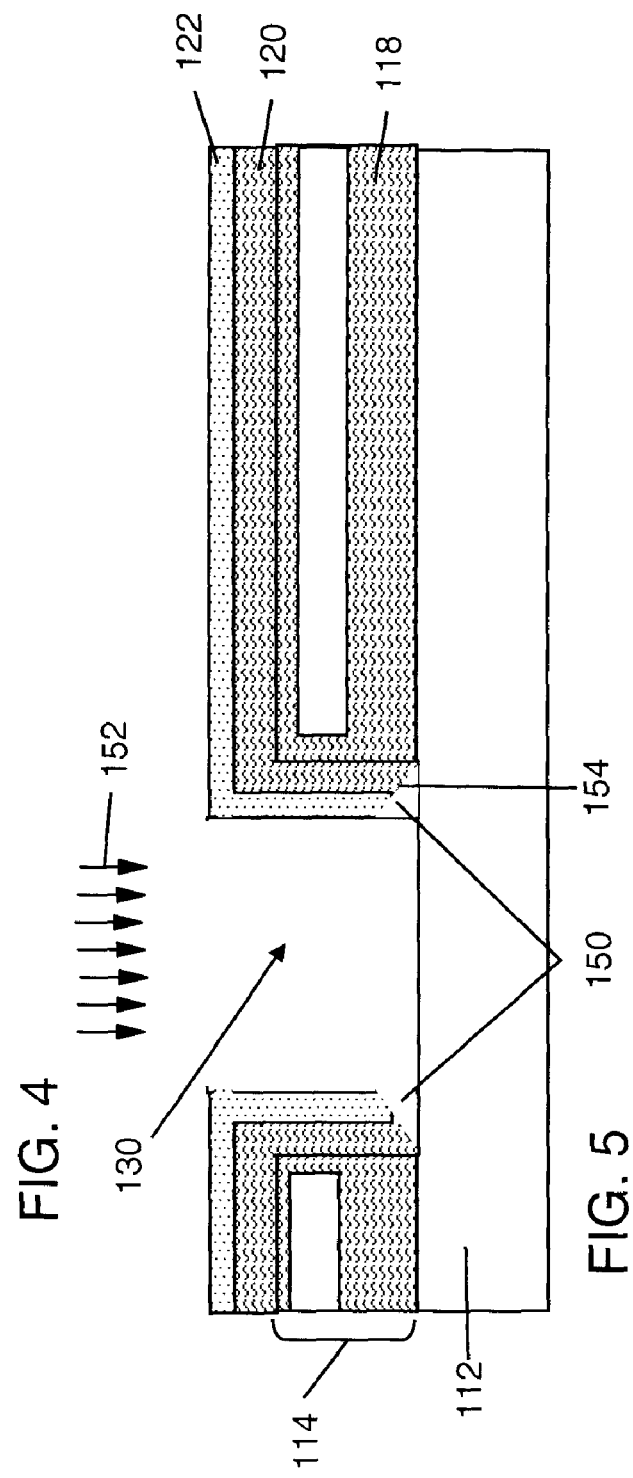
FIG. 4
FIG. 5

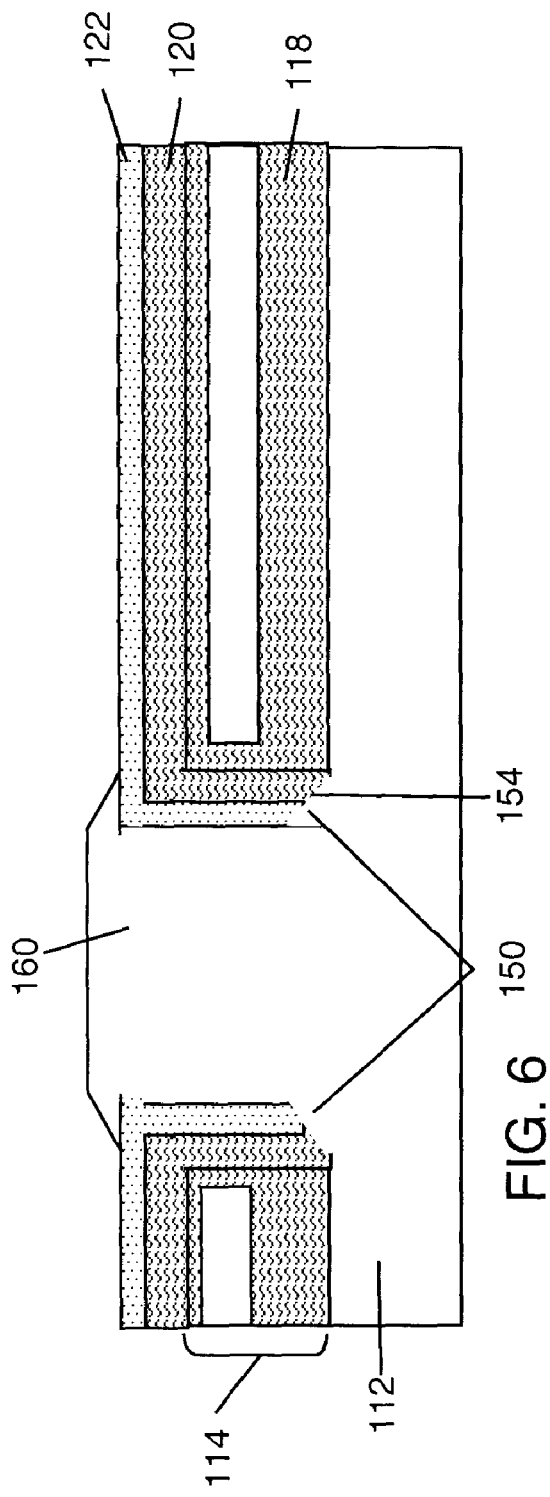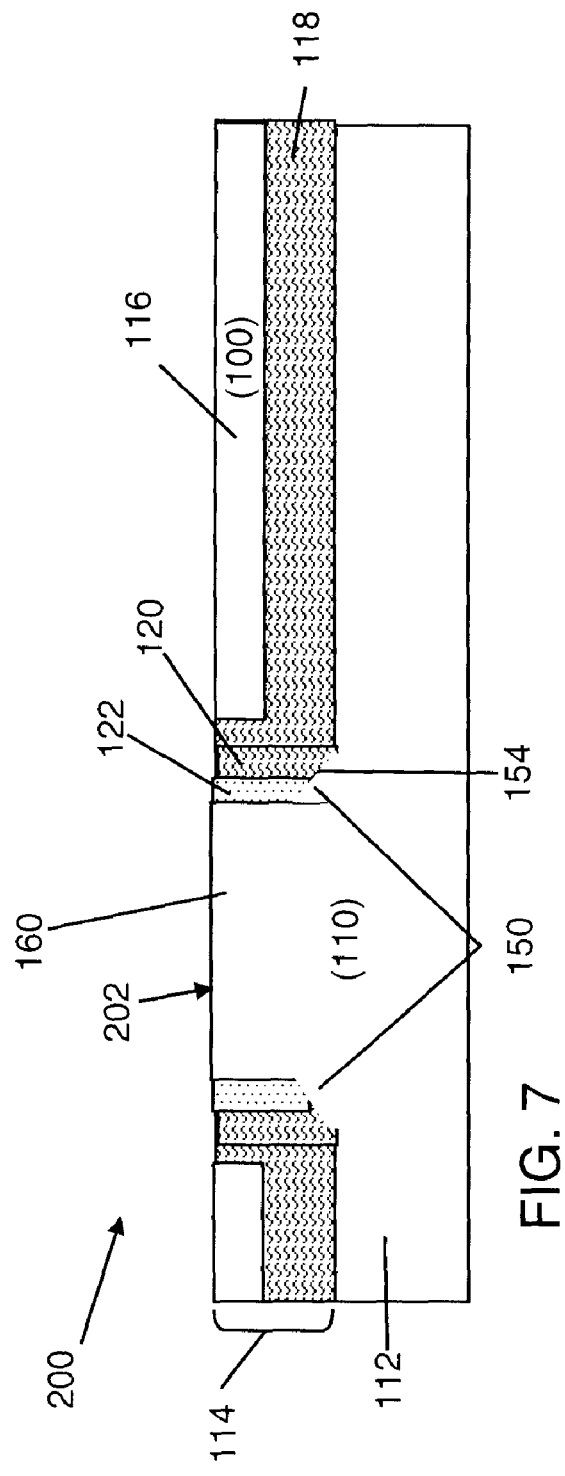

STACKING FAULT REDUCTION IN EPITAXIALLY GROWN SILICON

BACKGROUND OF THE INVENTION

1. Technical Field

The invention relates generally to microelectronics fabrication, and more particularly, to methods and structure with reduced stacking faults in epitaxially grown silicon.

2. Background Art

Performance improvement of semiconductor devices is a never-ending endeavor for manufacturers of those devices. One challenge currently faced by the semiconductor industry is implementing memory and logic devices on a single chip while maintaining process simplicity and transistor performance. These devices are referred to as "system-on-chips" (SoC) because the electronics for a complete, working product are contained on a single chip. One approach that is currently employed to improve performance of a SoC is to fabricate the different types of logic devices on silicon substrates having optimal surface orientations. As used herein, "surface orientation" refers to the crystallographic structure or periodic arrangement of silicon atoms on the surface of a wafer. In particular, an n-type field effect transistor (nFET) can be optimized by being generated on silicon having a (100) surface orientation, while a p-type field effect transistor (pFET) can be optimized by being generated on silicon having a (110) surface orientation. In addition, memory devices and nFETs are typically optimized when generated on silicon-on-insulator (SOI) substrates, while pFETs are typically optimized when generated on bulk silicon.

Fabricating the above-described hybrid orientation logic devices presents challenges. One widely accepted approach to generate the hybrid surface orientations includes bonding a silicon-on-insulator (SOI) wafer atop a bulk silicon substrate having a different surface orientation than the silicon of the SOI wafer. The bulk silicon surface orientation can be epitaxially grown from an opening to the bulk silicon substrate through the SOI wafer. For instance, if an nFET is to be created on a (100) surface orientation of the SOI wafer, the pFET can be generated on epitaxially grown silicon extending through the SOI wafer having a (110) surface orientation.

One challenge relative to the above-described technique, however, is growing stacking fault reduced structure. Stacking faults are planer defects which often occur in epitaxial films when the crystal stacking sequence is disrupted because of local environmental changes during growth, e.g., impurities or surface imperfections. The defects are characterized by the fact that the displacement between planes on either side of the defect is not a perfect crystal translation vector for the material in question. For instance, for face center cubic (fcc) materials, crystal grows in the <111> direction according to the well known close packing stacking sequence—ABCABC, where A, B and C are distinct stacking sites between which the crystal translation vector is (½) [110]. A stacking sequence of ABCAB//ABC contains a fault between planes "B" and "A" indicated by "//" and is termed an intrinsic stacking fault and can be thought of as the removal of a crystal plane ("C" in this case). In contrast, a stacking sequence of ABCA/C/BCABC is termed an extrinsic stacking fault and can be thought of as the insertion of an extra plane into the stacking sequence (in this case "C").

FIGS. 1A-B show one example of a technique for generated hybrid surface orientation areas on a single wafer. As shown in FIG. 1A, an opening 10 to a silicon substrate 12 is made through an SOI wafer 14 for epitaxially growing silicon having a surface orientation of substrate 12. A silicon nitride layer 22 is formed over opening 10. SOI wafer 14 includes a silicon layer 16 within a silicon oxide layer 18. As shown in FIG. 1B, when silicon nitride liner 22 is opened to silicon substrate 12, positively sloped corners 24 are created. As also shown in FIG. 1B, as silicon 26 is epitaxially grown, stacking faults 28 are created in silicon 26 in opening 10 (FIG. 1A) by positively sloped corners 24 at the bottom of opening 10 (FIG. 1A). In particular, as atoms stack on top of each other during epitaxial growth, they form in an orderly fashion. However, if a positive sloped corner 24 near a surface of silicon substrate 12 exists, the stacking sequence is disrupted by two causes. First, atomic arrangement on silicon nitride liner 22 is different from the atomic arrangement on the bare surface of silicon substrate 12. Second, since there is a slope in silicon nitride liner 22 (sloped corners 24) compared to the flat surface of silicon substrate 12, the atom stacking on top of each other on silicon nitride liner 24 is not the same as the bare surface of silicon substrate 12. As a result of the foregoing, the crystalline growth at positive sloped corners 24 is disrupted, causing a stacking fault 28 (i.e., missing or adding an extra plane (with <110> orientation based illustrative surface orientations)) from the foot of the side wall.

Subsequently, as shown in FIG. 1C, when a sharp edge 30 is formed at the bottom of silicon 26, grown in opening 10 (FIG. 1A), stacking faults 28 create problems for devices, such as leakage or non functional devices.

SUMMARY OF THE INVENTION

Methods and a structure are disclosed to suppress stacking faults in epitaxially grown silicon for use in hybrid surface orientation structures. In one embodiment, a method includes depositing a silicon nitride liner over a silicon oxide liner in an opening, etching to remove the silicon oxide liner and silicon nitride liner on a lower surface of the opening, undercutting the silicon nitride liner adjacent to the lower surface, and epitaxially growing silicon in the opening. The silicon has reduced stacking faults because of the negative slope created by the undercut.

A first aspect of the invention provides a method of epitaxially growing stacking fault reduced silicon in an opening to silicon, the method comprising: depositing a silicon nitride liner over a silicon oxide liner in the opening; etching to remove the silicon oxide liner and silicon nitride liner on a lower surface of the opening to expose the silicon; undercutting the silicon oxide liner under the silicon nitride liner adjacent to the lower surface; and epitaxially growing silicon in the opening, the epitaxially grown silicon filling the undercut.

A second aspect of the invention provides a method of forming a stacking fault reduced hybrid surface orientation structure, the method comprising: providing a silicon-on-insulator (SOI) substrate adhered to a bulk silicon substrate, the silicon of the SOI substrate having a different surface orientation than that of the bulk silicon substrate; forming an opening through the SOI substrate to the bulk silicon substrate; depositing a silicon nitride liner over a silicon oxide liner in the opening; etching to remove the silicon oxide liner and silicon nitride liner on a lower surface of the opening to expose the bulk silicon substrate; undercutting the silicon oxide liner under the silicon nitride liner adjacent to the lower surface; epitaxially growing silicon in the opening, the epitaxially grown silicon filling the undercut; and planarizing to form the stacking fault reduced hybrid surface orientation structure.

A third aspect of the invention provides an intermediate hybrid surface orientation structure comprising: a silicon-oninsulator (SOI) substrate adhered to a bulk silicon substrate, the silicon of the SOI substrate having a different surface orientation than that of the bulk silicon substrate; a reachthrough region extending through the SOI substrate to the bulk silicon substrate, the reachthrough region including a silicon nitride liner over a silicon oxide liner and a silicon epitaxially grown from the bulk silicon substrate, the epitaxially grown silicon extending into an undercut into the silicon oxide liner under the silicon nitride liner, wherein the epitaxially grown silicon is substantially stacking fault free.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 2-6 show various embodiments of a method according to the invention.

FIG. 7 shows an intermediate hybrid surface orientation structure according to one embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Turning to FIGS. 2-8, various embodiments of a method of epitaxially growing stacking fault reduced silicon 160 (FIGS. 7-8) in an opening 130 (FIGS. 4-5) to silicon will be described. The method is advantageous as part of a method forming an intermediate stacking fault reduced hybrid surface orientation structure 200 (FIG. 7).

Figure 2:
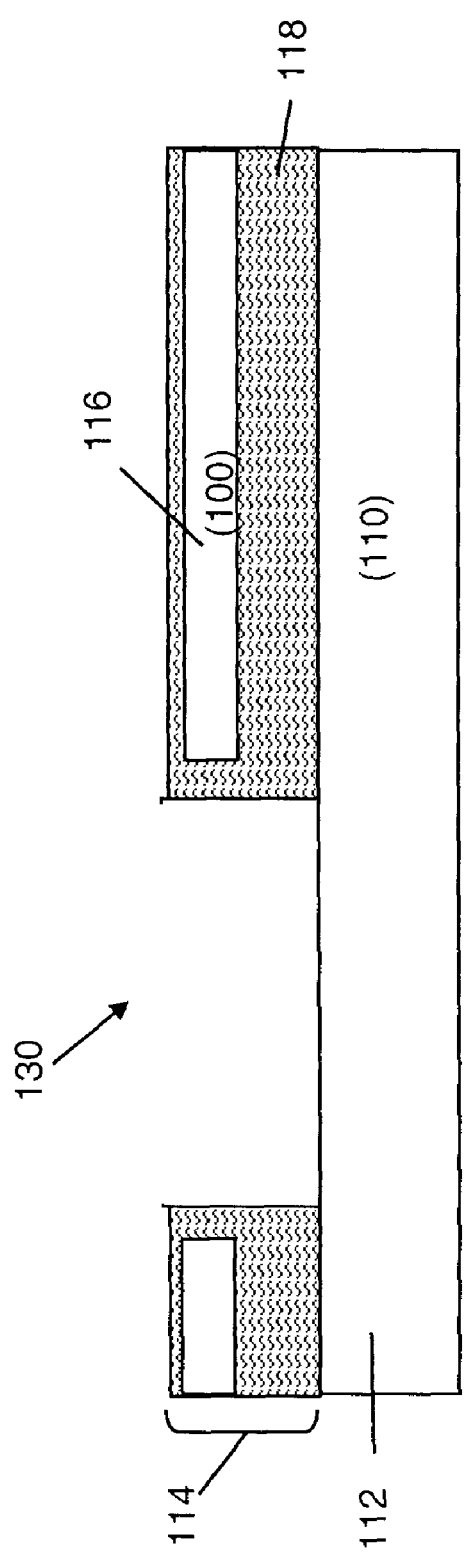

Turning to FIG. 2, if the method is used to form stacking fault reduced surface orientation structure 200 (FIG. 7), first, a silicon-on-insulator (SOI) substrate 114 is provided adhered to a bulk silicon substrate 112. SOI substrate 114 includes a silicon 116 within a buried silicon oxide (BOX) layer 118. As understood, silicon 116 of SOI substrate 114 has a different surface orientation than that of bulk silicon substrate 112. For example, as shown, silicon 116 has a surface orientation of (100), while bulk silicon substrate 112 has a surface orientation of (110). The surface orientations illustrated are only examples, and any different surface orientation set may be used.

Next, as also shown in FIG. 2, an opening 130 is formed through SOI substrate 114 to bulk silicon substrate 112. Opening 130 may be formed using any now known or later developed technique, e.g., depositing a photoresist, patterning the photoresist, etching the photoresist and etching opening 130.

Figure 3A:
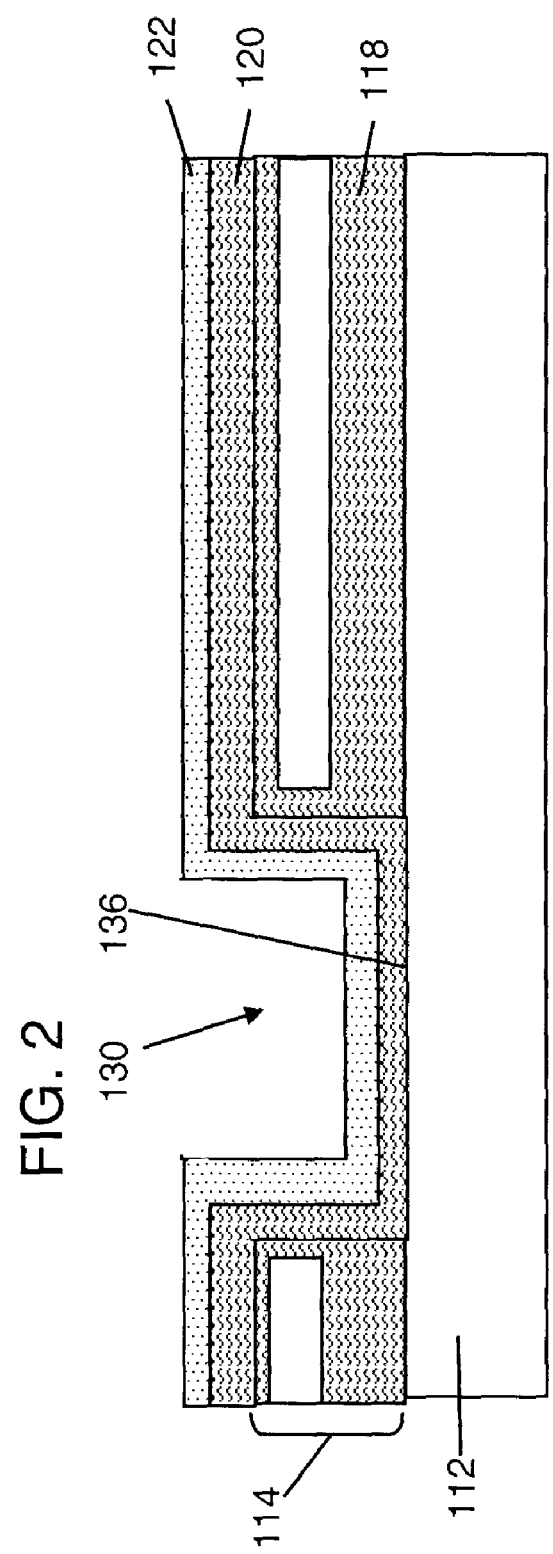
Figure 3B:
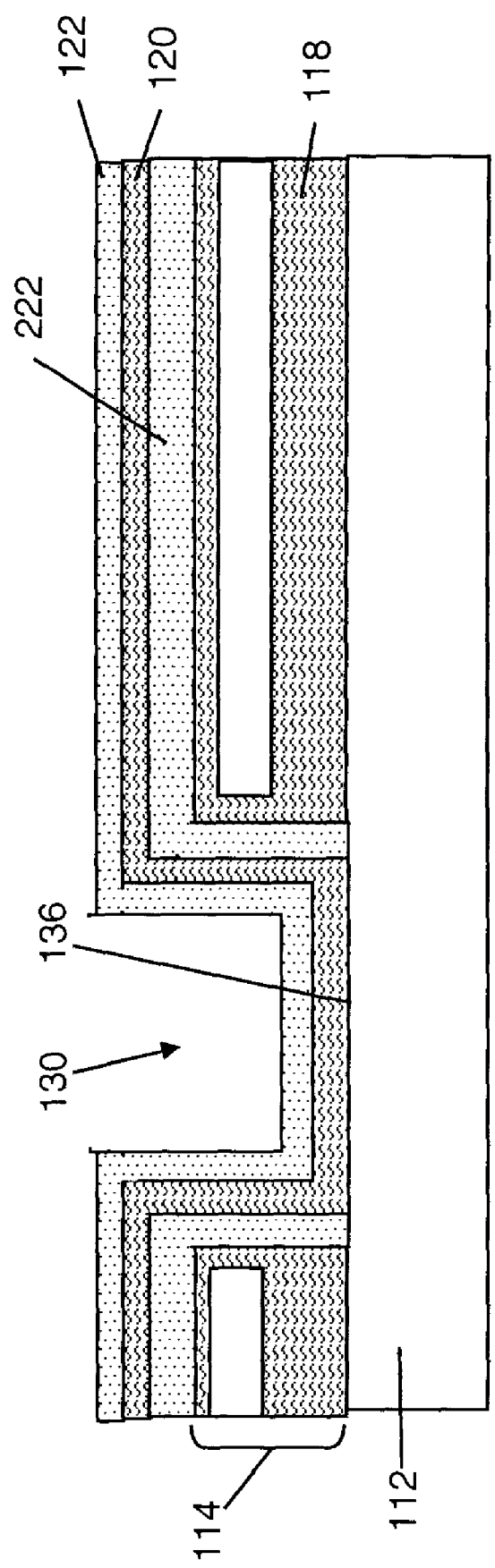

In FIG. 3A, a silicon oxide ($SiO_2$) liner 120 and a silicon nitride ($Si_3N_4$) liner 122 are deposited over opening 130. Silicon nitride liner 122 is over silicon oxide liner 120. The deposition may include any now known or later developed techniques such as: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), sputtering deposition, ion beam deposition, electron beam deposition, and laser assisted deposition. In one embodiment, silicon oxide liner 120 may have a thickness of approximately 100 Ångstroms to approximately 200 Ångstroms, and silicon nitride liner 122 may have a thickness of approximately 200 Ångstroms to approximately 400 Ångstroms. However, other dimensions are also possible within the scope of the invention. FIG. 3B shows an alternative embodiment in which a preliminary silicon nitride liner 222 is deposited and etched (e.g., RIE) to surface 136 prior to deposition of silicon oxide liner 120 and silicon nitride liner 122. While the following description is based on the embodiment of FIG. 3A, one with skill in the art will recognize that the procedures are substantially similar for the FIG. 3B embodiment.

FIG. 4 shows etching 134 to remove silicon oxide liner 120 and silicon nitride liner 122 on a lower surface 136 (FIG. 3A) of opening 130 to expose bulk silicon substrate 112. A sidewall 138 of silicon oxide liner 120 is revealed by this etching 134, which may include a reactive ion etch (RIE), a selective wet etch or other etching processes. As an option, a wet cleaning 140 may be performed at this stage to remove RIE residuals (not shown). Wet cleaning may include using a solution such as diluted hydrofluoric acid (DHF) and buffered hydrofluoric acid (BHF).

FIG. 5 shows undercutting silicon oxide liner 120 under silicon nitride liner 122 adjacent to lower surface 136 (FIG. 3A-B) to form an undercut 150. Undercutting may include performing a wet etch 152 selective to silicon oxide liner 120. As shown in FIG. 5, in one embodiment, undercut 150 may include a negatively sloped surface 154 (only one labeled), the significance of which will be described later. If the FIG. 3B embodiment was employed, then undercut 152 would extend under preliminary silicon nitride liner 222 also.

Figure 1A:
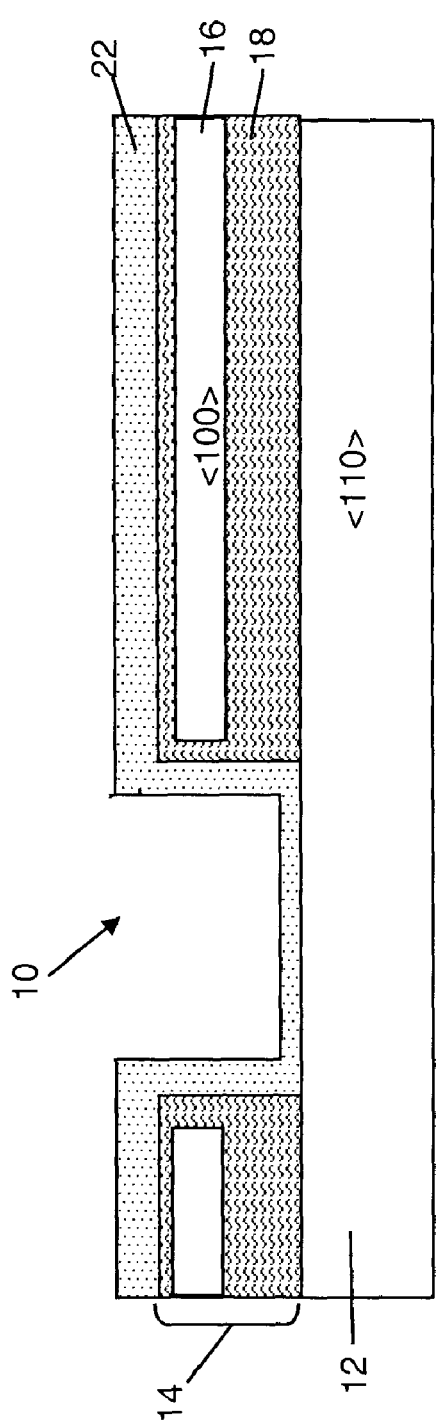
FIGS. 1A-C show cross-sectional views of a conventional approach to epitaxially growing silicon.
Figure 1B:
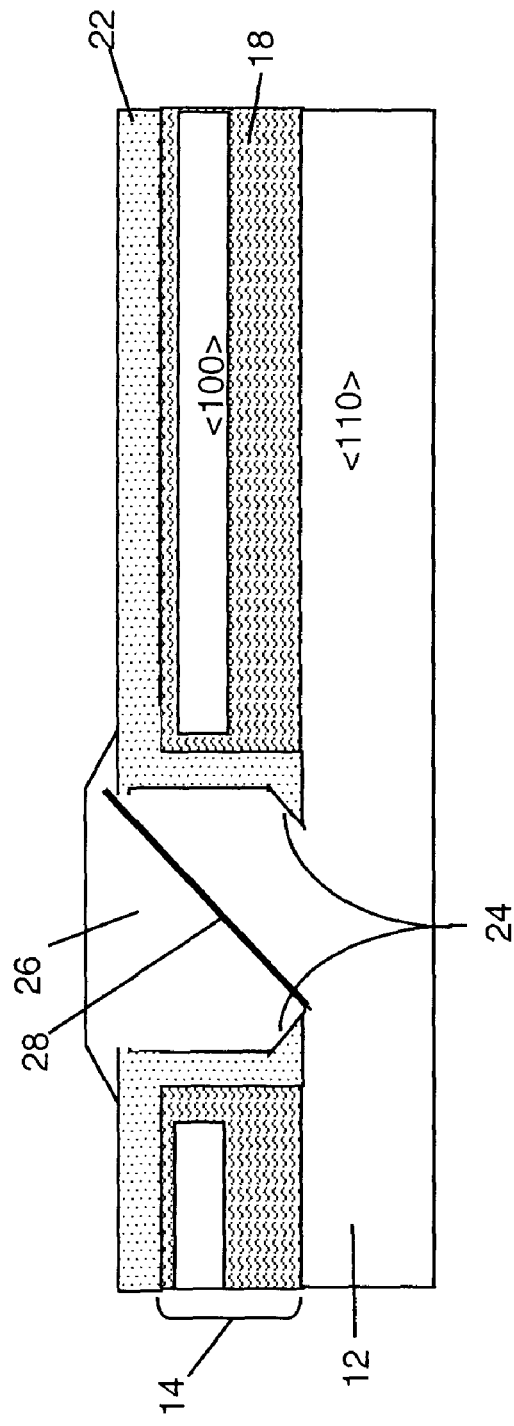
Figure 1C:
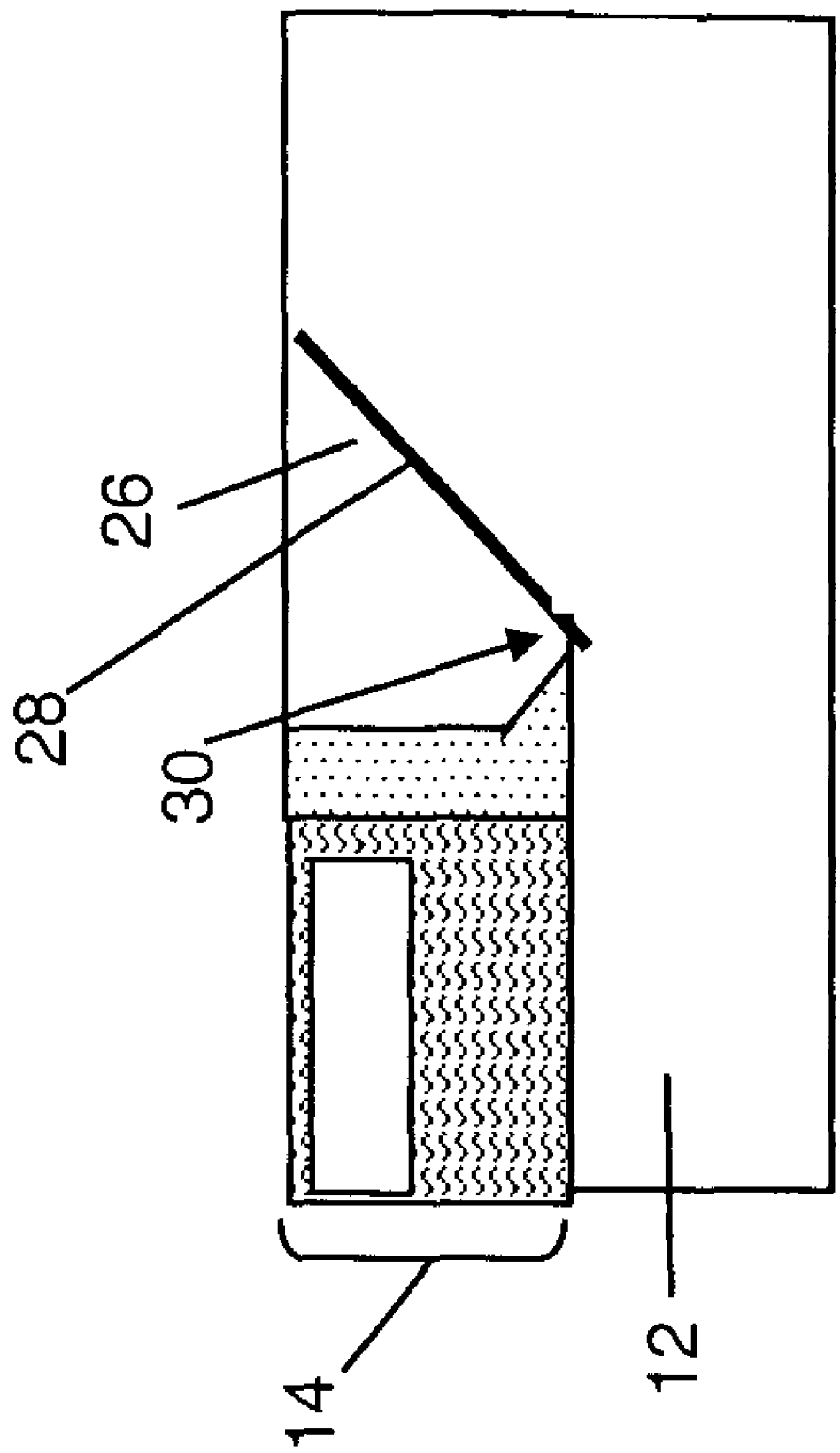

FIG. 6 shows epitaxially growing silicon 160 in opening 130 (FIG. 5), i.e., from bulk silicon substrate 112, such that silicon 160 fills undercut 150. That is, silicon 160 extends into undercut 150 into silicon oxide liner 120 under silicon nitride liner 122. It is believed that negatively sloped surface 154 of undercut 152 locks down silicon 160 locally so as to prevent stacking faults 28 (FIG. 1C). Silicon 160 has the same surface orientation as bulk silicon substrate 112, e.g., (110) as shown. If the FIG. 3B embodiment was employed, then silicon 160 would extend under preliminary silicon nitride liner 222 also.

Figure 8:
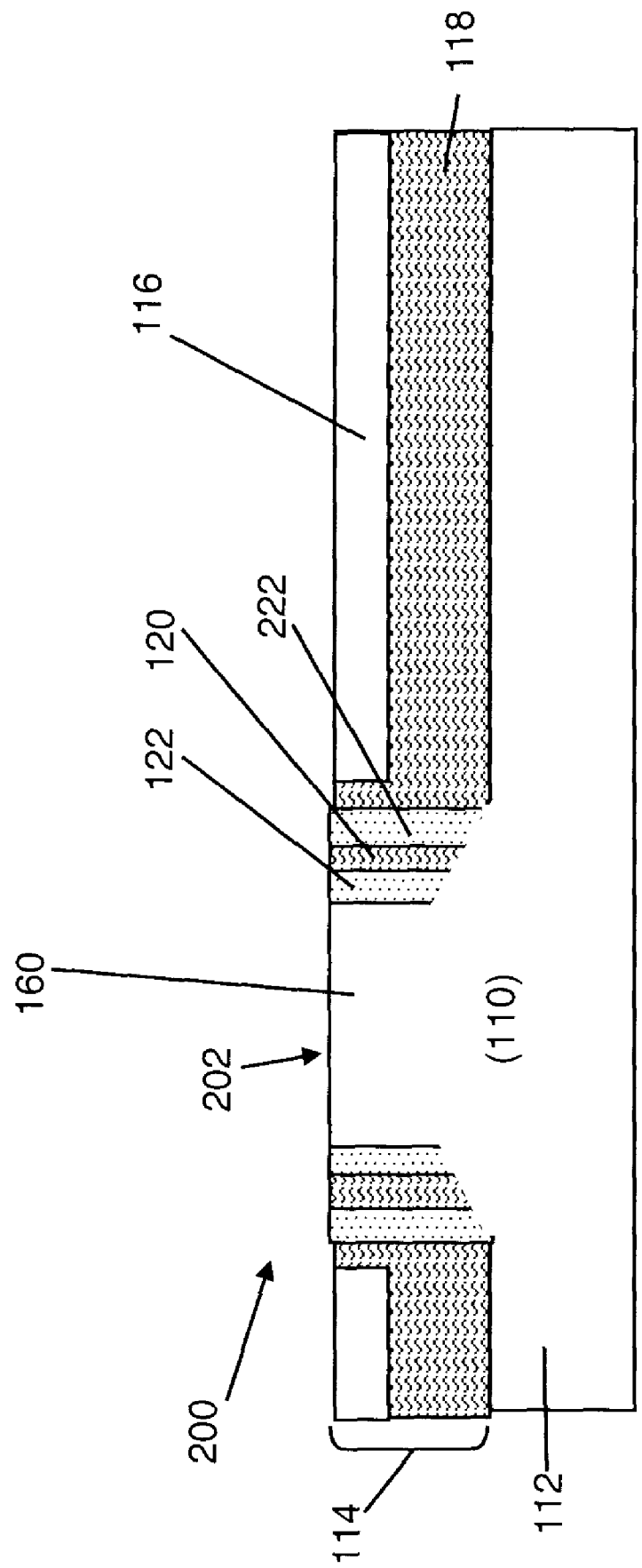
FIG. 8 shows an intermediate hybrid surface orientation structure according to another embodiment of the invention.

FIG. 7 shows a stacking fault reduced, intermediate hybrid surface orientation structure 200 after planarizing, e.g., using chemical mechanical polishing (CMP). Structure 200 is substantially free of stacking faults. The term "intermediate" indicates only that structure 200 will undergo subsequent known processing to arrive at a usable device, e.g., it may be sliced so as to remove silicon oxide liner 120 and silicon nitride liner 122. In one embodiment, intermediate hybrid surface orientation structure 200 includes SOI substrate 114 adhered to bulk silicon substrate 112. Silicon 116 of SOI substrate 114 has a different surface orientation than that of bulk silicon substrate 112. Silicon 160 filled opening 130 (FIG. 5) provides a reachthrough region 202 extending through SOI substrate 114 to bulk silicon substrate 112. Reachthrough region 202 includes silicon nitride liner 122 over silicon oxide liner 120 and a silicon 160 epitaxially grown from bulk silicon substrate 112 such that silicon 160 extends into undercut 150 into silicon oxide liner 120 under silicon nitride liner 122. Undercut 150 includes a negatively sloped surface 154 (one shown). As stated above, it is believed that negatively sloped surface 154 locks down silicon 160 locally so as to prevent stacking faults 28 (FIG. 1C). As the particular example shows, silicon 160 of reachthrough region 202 has a (110) surface orientation and silicon 116 of SOI substrate 114 has a (100) surface orientation. FIG. 8 shows structure 200 as though it were formed using the FIG. 3B embodiment.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An intermediate hybrid surface orientation structure comprising:
   a silicon-on-insulator (SOI) substrate directly adhered to a bulk silicon substrate, the silicon of the SOI substrate having a different surface orientation than that of the bulk silicon substrate, wherein the SOI substrate includes a silicon within a buried silicon oxide (BOX) layer; and
   a reachthrough region extending through the SOI substrate to the bulk silicon substrate, the reachthrough region including a silicon nitride liner positioned directly over a silicon oxide liner, the silicon nitride liner distinct from the silicon oxide liner, and a silicon epitaxially grown from the bulk silicon substrate, the epitaxially grown silicon extending into an undercut into the silicon oxide liner under the silicon nitride liner, the undercut directly contacting a surface of the bulk silicon substrate, wherein the undercut includes a negatively sloped surface, wherein the epitaxially grown silicon is substantially stacking fault free.

2. The structure of claim 1, wherein the silicon oxide liner has a thickness of approximately 100 Ångstroms to approximately 200 Ångstroms, and the silicon nitride liner has a thickness of approximately 200 Ångstroms to approximately 400 Ångstroms.

3. The structure of claim 1, wherein the bulk silicon substrate has a (100) surface orientation and the silicon of the SOI substrate has a (110) surface orientation.

4. The structure of claim 3, wherein the epitaxially grown silicon has the same (100) surface orientation as the bulk silicon substrate.

5. The structure of claim 1, further comprising a preliminary silicon nitride liner under the silicon oxide liner.

6. The structure of claim 1, wherein the bulk silicon substrate has a (110) surface orientation and the silicon of the SOI substrate has a (100) surface orientation.

7. The structure of claim 6, wherein the epitaxially grown silicon has the same (110) surface orientation as the bulk silicon substrate.

* * * * *